United States Patent
Kim et al.

(10) Patent No.: US 8,482,890 B2
(45) Date of Patent: Jul. 9, 2013

(54) PCB STRIP AND MANUFACTURING METHOD FOR ELECTRONIC COMPONENT EMBEDDED PCB

(75) Inventors: Moon-il Kim, Daejeon (KR); Yul-Kyo Chung, Yongin-si (KR); Hwa-Sun Park, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 288 days.

(21) Appl. No.: 12/821,651

(22) Filed: Jun. 23, 2010

(65) Prior Publication Data
US 2011/0176246 A1    Jul. 21, 2011

(30) Foreign Application Priority Data
Jan. 19, 2010   (KR) .................. 10-2010-0004876

(51) Int. Cl.
*H02H 3/22*    (2006.01)
(52) U.S. Cl.
USPC ............................. 361/56; 361/111

(58) Field of Classification Search
USPC ................................... 361/56, 111
See application file for complete search history.

(56) References Cited

U.S. PATENT DOCUMENTS

| | | | |
|---|---|---|---|
| 2005/0078232 A1* | 4/2005 | Lo et al. | 349/40 |
| 2008/0165300 A1* | 7/2008 | Sung et al. | 349/40 |

* cited by examiner

*Primary Examiner* — Danny Nguyen
(74) *Attorney, Agent, or Firm* — McDermott Will & Emery LLP

(57) ABSTRACT

A PCB strip and a method of manufacturing an electronic component embedded printed circuit board are disclosed. The PCB strip in accordance with an embodiment of the present invention includes a unit area, which has a plurality of substrate units provided therein, and a dummy area, which is provided on an outer side of the unit area. Here, an electronic component can be embedded in the substrate unit, and an electrostatic discharge preventing component for protecting the electronic component from an electrostatic discharge can be embedded in the dummy area.

8 Claims, 8 Drawing Sheets

PCB STRIP AND MANUFACTURING METHOD FOR ELECTRONIC COMPONENT EMBEDDED PCB

CROSS-REFERENCE TO RELATED APPLICATIONS

This application claims the benefit of Korean Patent Application No. 10-2010-0004876, filed with the Korean Intellectual Property Office on Jan. 19, 2010, the disclosure of which is incorporated herein by reference in its entirety.

BACKGROUND

1. Technical Field

The present invention is related to a PCB strip and a method of manufacturing an electronic component embedded printed circuit board.

2. Description of the Related Art

In the electronic component industry, there recently have been continuous efforts to provide more functionalities in electronic components having a limited surface area. As part of the next generation multi-functional/small package technologies, development of electronic component embedded printed circuit boards is recently receiving attention. Nevertheless, since the electronic component embedded printed circuit board has active/passive components, which are vulnerable to electric shocks, embedded therein, the electronic components may be damaged by the electric shocks.

Since the electronic components, such as various types of active/passive components, are very sensitive to electrostatic discharges (ESD), the electronic components need to be protected from the electrostatic discharges in order to provide reliability in the final products. For this, the completed form of electronic product has various types of electrostatic discharge preventing components embedded therein in order to block the electrostatic discharge.

Accordingly, in the case of the electronic component embedded printed circuit board, for which the mass production is gradually expanding, the electronic components need to be protected from the electrostatic discharges during the manufacturing process of the printed circuit board.

SUMMARY

The present invention provides a PCB strip that can protect an electronic component, which is embedded in the printed circuit board, from electrostatic discharges, and a method of manufacturing an electronic component embedded printed circuit board.

An aspect of the present invention provides a printed circuit board (PCB) strip. The PCB strip in accordance with an embodiment of the present invention can include a unit area, which has a plurality of substrate units provided therein, and a dummy area, which is provided on an outer side of the unit area. Here, an electronic component can be embedded in the substrate unit, and an electrostatic discharge preventing component for protecting the electronic component from an electrostatic discharge can be embedded in the dummy area.

The electronic component and the electrostatic discharge preventing component can be embedded in a same layer, and the electrostatic discharge preventing component can be one of a varistor, a TVS diode, a zener diode and an ESD component.

Another aspect of the present invention provides a method of manufacturing an electronic component embedded printed circuit board. The method in accordance with an embodiment of the present invention can include preparing an insulation substrate that is divided into a unit area and a dummy area, in which the unit area includes a plurality of substrate units and the dummy area is disposed on an outer side of the unit area, processing a cavity in each of the unit area and the dummy area of the insulation substrate, embedding an electronic component in the cavity of the unit area and embedding an electrostatic discharge preventing component for protecting the electronic component from an electrostatic discharge in the cavity of the dummy area, electrically connecting the electronic component and the electrostatic discharge preventing component with each other, and dividing the unit area into individual substrate units.

The electrostatic discharge preventing component can be one of a varistor, a TVS diode, a zener diode and an ESD component.

The cavity can penetrate through the insulation substrate, and the embedding of the electronic component and the electrostatic discharge preventing component can include adhering an adhesive tape on a lower surface of the insulation substrate, adhering the electronic component and the electrostatic discharge preventing component to a surface of the adhesive tape such that the electronic component and the electrostatic discharge preventing component are housed in the cavity, stacking a first insulation layer on an upper surface of the insulation substrate, and removing the adhesive tape and stacking a second insulation layer on the lower surface of the insulation substrate.

A thickness of the first insulation layer can be same as a thickness of the second insulation layer, and a thickness of the electronic component can be same as a thickness of the insulation substrate.

Additional aspects and advantages of the present invention will be set forth in part in the description which follows, and in part will be obvious from the description, or may be learned by practice of the invention.

DETAILED DESCRIPTION

Figure 1:
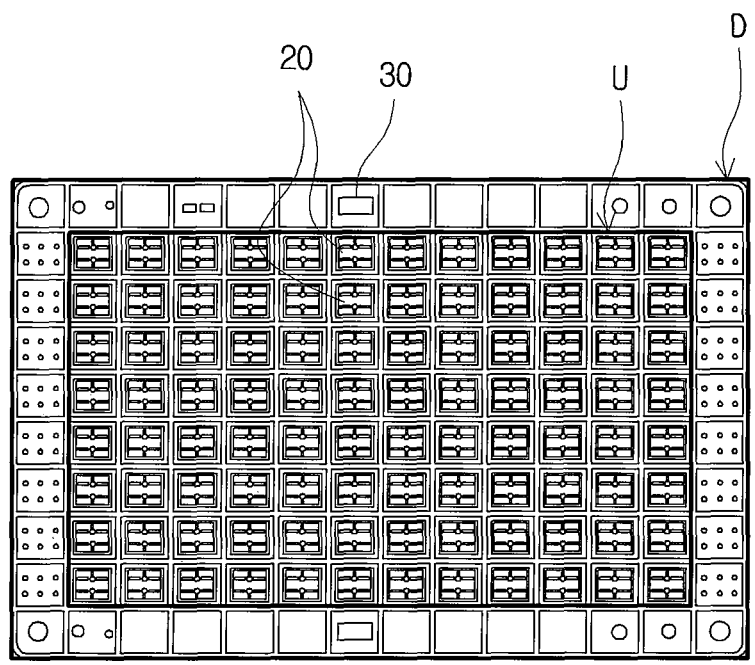
FIG. 1 is a cross-sectional plan view of a PCB strip in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed descriptions of related art are omitted when it is deemed that they may unnecessarily obscure the essence of the invention.

A PCB strip and a method of manufacturing an electronic component embedded printed circuit board in accordance with certain embodiments of the present invention will be described below in more detail with reference to the accompanying drawings. Those components that are the same or are in correspondence are rendered the same reference numeral regardless of the figure number, and redundant descriptions are omitted.

Figure 2:
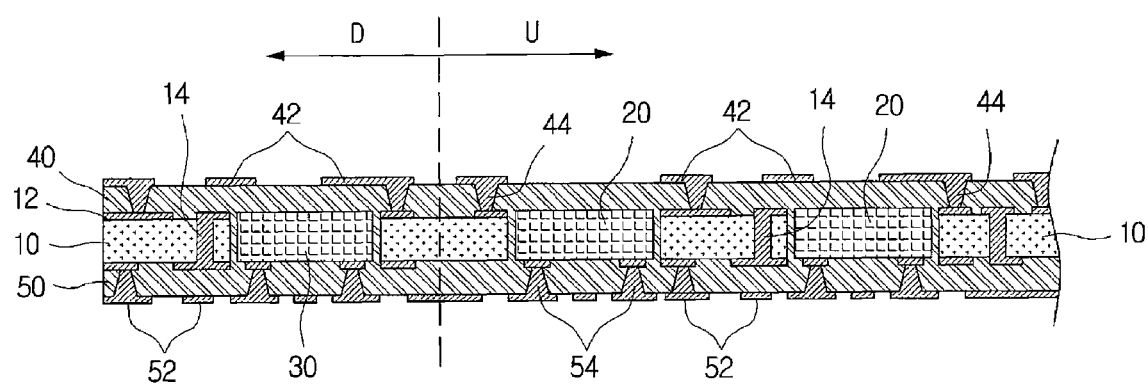
FIG. 2 is a cross-sectional side view of a PCB strip in accordance with an embodiment of the present invention.

FIG. 1 is a cross-sectional plan view of a PCB strip in accordance with an embodiment of the present invention, and FIG. 2 is a cross-sectional side view of a PCB strip in accordance with an embodiment of the present invention. Illustrated in FIGS. 1 and 2 are a unit area U, a dummy area D, an insulation substrate 10, electronic components 20 and an electrostatic discharge preventing component 30.

The PCB strip of the present embodiment is mainly constituted by the unit area U and the dummy area D. The unit area U, in which a plurality of substrate units are provided, is divided into individual units in a following process. The divided substrate units can form individual products.

The individual substrate unit has circuit patterns 42 and 52 and various types of pads formed thereon. A plurality of substrate units are separated from one another, and one or more electronic components 20 are embedded in each substrate unit. Accordingly, each substrate unit can function as a printed circuit board having the electronic component 20 embedded therein.

The dummy area D is provided on an outer side of the unit area U of the PCB strip. Although the dummy area D is formed to surround the entire unit area U, as illustrated in FIG. 1, it is also possible that the dummy area D can be formed on any one side or both sides of the unit area U only. The dummy area D is removed after the treatment and package processes of the PCB strip are completed, and thus the dummy area D does not remain in the final product. Although it is not illustrated in the drawings, a mold gate, which is used when molding, a tooling hole, which is used as a basis in processing the PCB strip, a slot, which prevents the warpage of the PCB strip, an alignment mark and the like can be formed in the dummy area D.

The electrostatic discharge preventing component 30 for protecting the electronic component 20, which is embedded in the unit area U, from electrostatic discharges can be embedded in the dummy area D. This is to sufficiently prevent the electronic component 20 from being damaged by the electrostatic discharges that may occur after the electronic component 20 is embedded in the unit area U. One or more electrostatic discharge preventing components 30 can be embedded in the dummy area D. Here, a varistor, a TVS diode, a zener diode, an ESD component and the like can used for the electrostatic discharge preventing component 30.

In order to prevent the electronic component 20 from being damaged by the electrostatic discharges, the electrostatic discharge preventing component 30 and the electronic component 20 can be electrically connected to each other through, for example, a wiring pattern. The wiring pattern is for protecting the electronic component 20 and can be designed separately from the circuit patterning that is for the substrate units The electronic component 20 embedded in the unit area U and the electrostatic discharge preventing component 30 embedded in the dummy area D can be embedded in a same layer. If the electronic component 20 and the electrostatic discharge preventing component 30 were embedded in the same layer, patterning for electrically connecting the electronic component 20 and the electrostatic discharge preventing component 30 with each other could be performed more easily. However, the present invention is not limited to this embodiment, and the electronic component 20 and the electrostatic discharge preventing component 30 can be embedded in different layers, depending on the design requirement.

Hitherto, the structure of a PCB strip in which the unit area U and the dummy area D are coupled to each other has been described in accordance with an aspect of the present invention. Hereinafter, a method of manufacturing an electronic component embedded printed circuit board in accordance with another aspect of the present invention will be described with reference to FIGS. 3 to 8.

Figure 3:
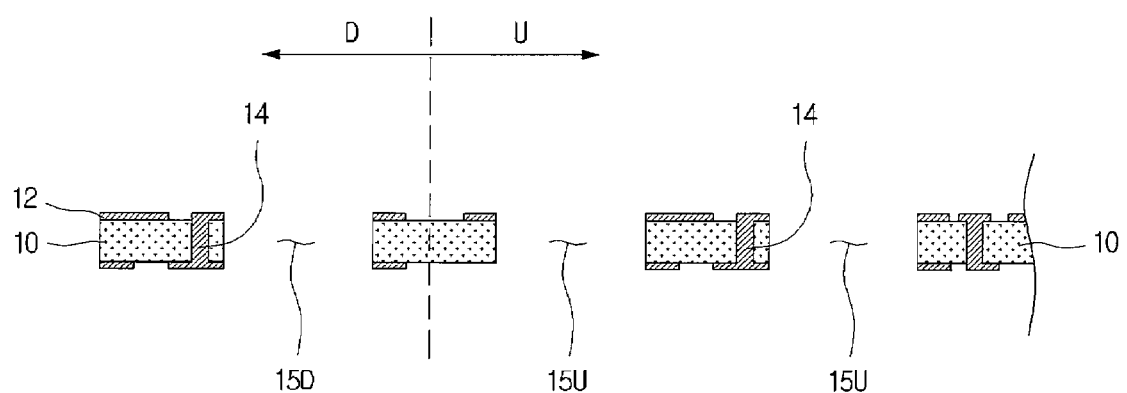
FIGS. 3 to 8 are diagrams illustrating each process of manufacturing an electronic component embedded printed circuit board in accordance with an embodiment of the present invention.

First, after preparing an insulation substrate 10 that is divided into a unit area U, which includes a plurality of substrate units, and a dummy area D, which is provided on an outer side of the unit area U, cavities 15U and 15D are processed in the unit area U and the dummy area D of the insulation substrate 10, respectively (refer to FIG. 3). It is preferred that each of the cavities 15U and 15D has a sufficient size such that the electronic component 20 and the electrostatic discharge preventing component 30 can be embedded in the respective cavities 15U and 15D. Here, the cavities 15U and 15D can either penetrate or not penetrate through the insulation substrate 10. However, in the present embodiment described below, the cavities 15U and 15D penetrate through the insulation substrate 10. Meanwhile, inner layer circuits 12 can be preformed on the surface of the insulation substrate 10 before the cavities 15U and 15D are processed. The inner layer circuits 12 formed on both surfaces of the insulation substrate 10 can be electrically connected to each other by a via 14 penetrating through the insulation substrate 10.

Then, the electronic component 20 is embedded inside the cavity 15U of the unit area U, and the electrostatic discharge preventing component 30 for protecting the electronic component 20 from the electrostatic discharges is embedded inside the cavity 15D of the dummy area D. Specifically, while the electronic component 20 is embedded in the unit area U in order to manufacture an electronic component embedded printed circuit board, the electrostatic discharge preventing component 30 can be embedded in the dummy area D. The electrostatic discharge preventing component 30 embedded in the dummy area D can function to protect the electronic component 20 from the electrostatic discharges that may occur in a following process. The above process will be described in more detail hereinafter.

Figure 4:
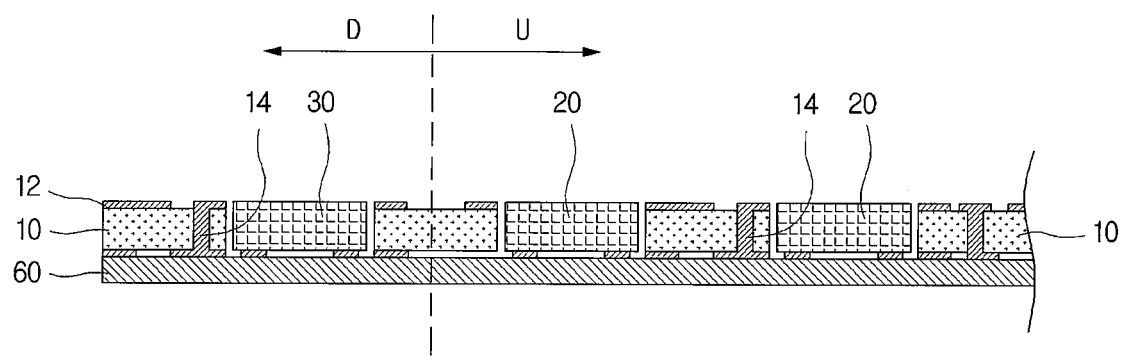

First, as illustrated in FIG. 4, an adhesive tape 60 is adhered to a lower surface of the insulation substrate 10, and then the electronic component 20 and the electrostatic discharge preventing component 30 are adhered to the surface of the adhesive tape 60 such that the electronic component 20 and the electrostatic discharge preventing component 30 can be housed in the cavities 15U and 15D. Here, the adhesive tape 60 is temporarily used for embedding the electronic component 20 and the electrostatic discharge preventing component 30 and fixing the positions thereof. As described above, a varistor, a TVS diode, a zener diode, an ESD component and the like can used for the electrostatic discharge preventing component 30.

Here, the thickness of the electronic component 20 can be the same as that of the insulation substrate 10. By making the thickness of the electronic component 20 the same as that of the insulation substrate 10, geometrical symmetry of the insulation substrate 10, in which the electronic component 20 is embedded, can be secured, and thus the warpage of the insulation substrate 10 can be improved.

Figure 5:
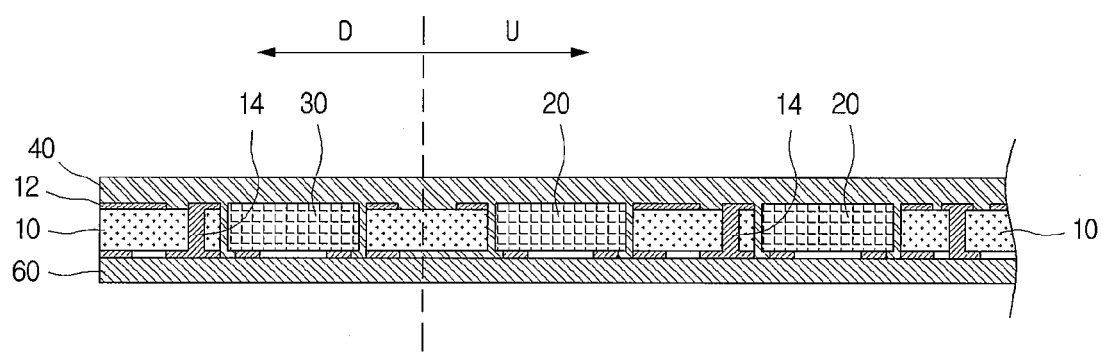

Next, as illustrated in FIG. 5, a first insulation layer 40 is stacked on an upper surface of the insulation substrate 10. Here, the first insulation layer 40 can be first stacked in semisolid state and then can be hardened. Here, the first insulation layer 40 can function to fix the electronic component 20 and the electrostatic discharge preventing component 30 by filling the empty space of the cavities 15U and 15D, in which the electronic component 20 and the electrostatic discharge preventing component 30 are embedded.

Figure 6:
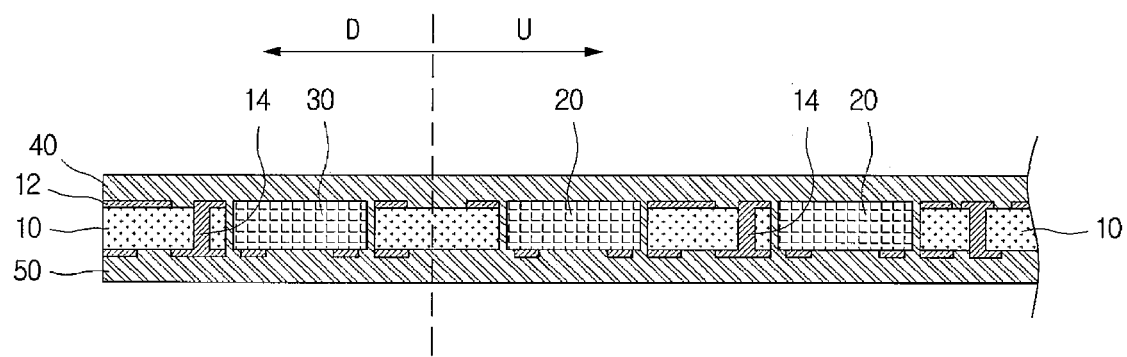

Next, as illustrated in FIG. 6, the adhesive tape 60 is removed, and then a second insulation layer 50 is stacked on the lower surface of the insulation substrate 10. Specifically, after the adhesive tape 60, which is temporarily adhered to the insulation substrate 10 in order to fix the positions of the electronic component 20 and the electrostatic discharge preventing component 30, is removed, the surface of the insulation substrate 10 is cleaned smoothly, and then the second insulation layer 50 is stacked on the lower surface of the insulation substrate 10. The second insulation layer 50 can be made of the same material as that of the first insulation layer 40, and the thickness of the second insulation layer 50 can be the same as that of the first insulation layer 40. By setting the same thickness of the first insulation layer 40 and the second insulation layer 50, which are stacked on upper and lower surfaces of the insulation substrate 10, respectively, geometrical symmetry that is formed from the insulation substrate 10, in which the electronic component 20 is embedded, can be provided, and thus the warpage of the insulation substrate 10 can be improved. Moreover, since no other materials, such as a chip bond and a non-conductive paste (NCP), other than the embedded electronic component 20 and the stacking material are used and the use of different types of materials is minimized, the productivity can be improved.

Figure 7:
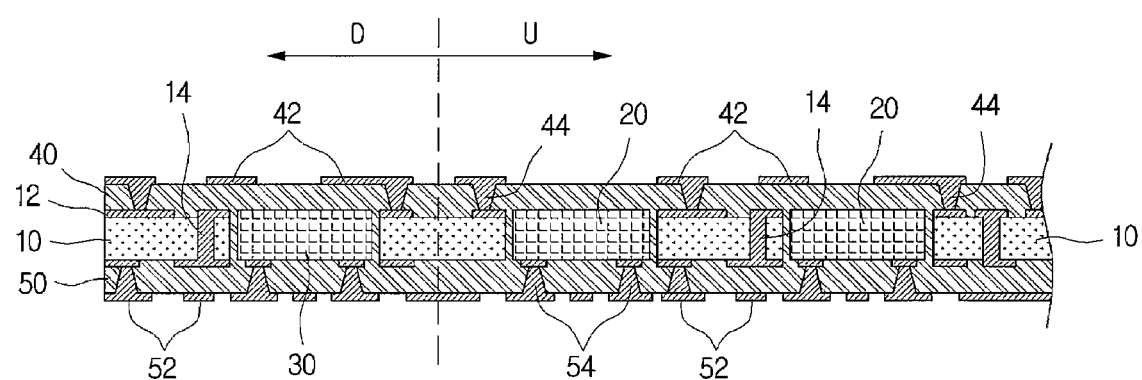
Figure 8:
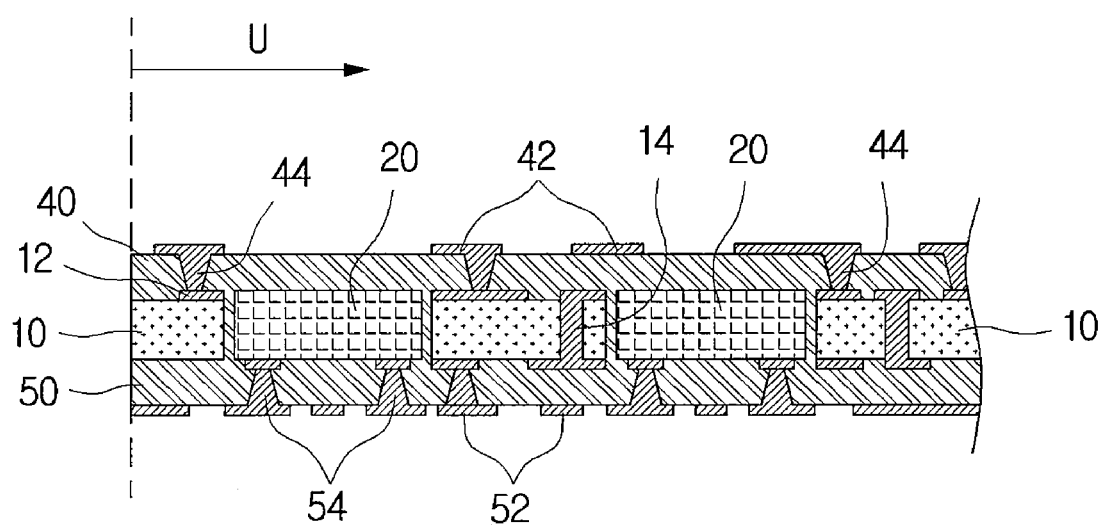

Next, as illustrated in FIG. 7, the electronic component 20 and the electrostatic discharge preventing component 30 are electrically connected to each other through the use of circuits 12, 42 and 52 and vias 14, 44 and 54. Since the electronic component 20 embedded in the unit area U and the electrostatic discharge preventing component 30 embedded in the dummy area D are electrically connected to each other through a plurality of the circuits 12, 42 and 52 and vias 14, 44 and 54, which are formed on the insulation substrate 10, the first insulation layer 40 and the second insulation layer 50, respectively, the electronic component 20 can be prevented from the electrostatic discharges that may occur during the manufacturing or packaging process of the printed circuit board.

Later, a packaging process, such as surface-mounting a semiconductor chip, is performed for each of the substrate units of the unit area U, and then the unit area U is divided into individual substrate units. The divided individual substrate unit functions as a single product.

By utilizing certain embodiments of the present invention as set forth above, an electronic component that is embedded in a printed circuit board can be protected from electrostatic discharges during the manufacturing process of the printed circuit board.

While the spirit of the invention has been described in detail with reference to certain embodiments, the embodiments are for illustrative purposes only and shall not limit the invention. It is to be appreciated that those skilled in the art can change or modify the embodiments without departing from the scope and spirit of the invention.

As such, many embodiments other than those set forth above can be found in the appended claims.

What is claimed is:

1. A printed circuit board (PCB) strip comprising:
   a unit area having a plurality of substrate units provided therein; and
   a dummy area provided on an outer side of the unit area, wherein:
   an electronic component is embedded in the substrate unit,
   an electrostatic discharge preventing component for protecting the electronic component from an electrostatic discharge is embedded in the dummy area,
   the unit area is a first part that is divided into the substrate units to form individual products, and
   the dummy area is a second part that is removed from the unit area and does not remain in the individual products.

2. The PCB strip of claim 1, wherein the electronic component and the electrostatic discharge preventing component are embedded in a same layer.

3. The PCB strip of claim 1, wherein the electrostatic discharge preventing component is one of a varistor, a TVS diode, a zener diode and an ESD component.

4. A method of manufacturing an electronic component embedded printed circuit board, the method comprising:
   preparing an insulation substrate that is divided into a unit area and a dummy area, the unit area including a plurality of substrate units, the dummy area being disposed on an outer side of the unit area;
   processing a cavity in each of the unit area and the dummy area of the insulation substrate;
   embedding an electronic component in the cavity of the unit area and embedding an electrostatic discharge preventing component for protecting the electronic component from an electrostatic discharge in the cavity of the dummy area;
   electrically connecting the electronic component and the electrostatic discharge preventing component with each other; and
   dividing the unit area into individual substrate units.

5. The method of claim 4, wherein the electrostatic discharge preventing component is one of a varistor, a TVS diode, a zener diode and an ESD component.

6. The method of claim 4, wherein the cavity penetrates through the insulation substrate, and
   the embedding of the electronic component and the electrostatic discharge preventing component comprises:
   adhering an adhesive tape on a lower surface of the insulation substrate;
   adhering the electronic component and the electrostatic discharge preventing component to a surface of the adhesive tape such that the electronic component and the electrostatic discharge preventing component are housed in the cavity;
   stacking a first insulation layer on an upper surface of the insulation substrate; and
   removing the adhesive tape and stacking a second insulation layer on the lower surface of the insulation substrate.

7. The method of claim 6, wherein a thickness of the first insulation layer is same as a thickness of the second insulation layer.

8. The method of claim 6, wherein a thickness of the electronic component is same as a thickness of the insulation substrate.

* * * * *